United States Patent
Kurihara (10) Patent No.: US 7,582,906 B2
(45) Date of Patent: Sep. 1, 2009

(54) LIGHTING DEVICE AND DISPLAY DEVICE PROVIDED WITH THE SAME

(75) Inventor: Makoto Kurihara, Chiba (JP)

(73) Assignee: Seiko Instruments Inc. (JP)

( * ) Notice: Subject to any disclaimer, the term of this patent is extended or adjusted under 35 U.S.C. 154(b) by 189 days.

(21) Appl. No.: 11/715,682

(22) Filed: Mar. 8, 2007

(65) Prior Publication Data

US 2007/0210326 A1    Sep. 13, 2007

(30) Foreign Application Priority Data

| | | |
|---|---|---|
| Mar. 9, 2006 | (JP) | ............................. 2006-063498 |
| Oct. 3, 2006 | (JP) | ............................. 2006-271968 |
| Feb. 9, 2007 | (JP) | ............................. 2007-030284 |

(51) Int. Cl.
*H01L 27/15* (2006.01)
*H01L 31/12* (2006.01)
*H01L 33/00* (2006.01)

(52) U.S. Cl. .................... 257/79; 257/88; 257/E33.001; 257/E33.018; 362/293; 362/297; 362/304

(58) Field of Classification Search .................... 257/79, 257/88, 98, 99, 100, E51.018, E51.002, E33.001, 257/E33.077; 362/293, 297, 304, 346
See application file for complete search history.

(56) References Cited

U.S. PATENT DOCUMENTS

| | | | |
|---|---|---|---|
| 2006/0034084 A1* | 2/2006 | Matsuura et al. | ............. 362/293 |
| 2007/0189352 A1* | 8/2007 | Nagahama et al. | ............ 372/71 |
| 2008/0231170 A1* | 9/2008 | Masato et al. | ................ 313/501 |

* cited by examiner

*Primary Examiner*—Phuc T Dang
(74) *Attorney, Agent, or Firm*—Adams & Wilks (57) ABSTRACT

A lighting device surface-emits light from a light emitting surface of a light emitting element and guides the emitted light using a light guide member. The lighting device has a first wavelength conversion member for converting light emitted from the light emitting device into light having a first peak wavelength and a second wavelength conversion member for converting light emitted from the light emitting device into light having a wavelength shorter than the first peak wavelength. The first wavelength conversion member is provided between the light emitting element and the light guide member and is contained in a resin potting the light emitting element. A film has a layer containing the second wavelength conversion member. The film is provided on a light emitting surface side of the light guide member.

22 Claims, 7 Drawing Sheets

LIGHTING DEVICE AND DISPLAY DEVICE PROVIDED WITH THE SAME

BACKGROUND OF THE INVENTION

1. Field of the Invention

The present invention relates to a lighting device for illuminating a display element of a non-self light emission type and to a display device used in electronic equipment. In particular, the present invention relates to a liquid crystal display device used in mobile information equipment, a mobile phone, and the like and to a lighting device, such as a front light or a backlight, for illuminating the display element.

2. Description of the Related Art

A display device which has been used in a mobile phone or a mobile computer in recent years often employs a liquid crystal display device capable of obtaining a high-resolution color image with low power consumption. The liquid crystal display device employs a liquid crystal element of a non-self light emission type, and therefore the liquid crystal element is illuminated by using a lighting device having a high-intensity white LED as a light source.

Specifically, the mobile phone employs a reflective liquid crystal device which is bright and has a large aperture or another liquid crystal device capable of displaying image information on both front and back sides. A white LED used for illuminating the display elements thereof is structured such that a resin containing yellow phosphors dispersed therein is provided immediately in front of a light emitting surface of a blue LED of an InGaN system, a GaN system, or the like. With this structure, original blue light is mixed with yellow light, thereby producing white light. As regards a phosphor for converting blue light into yellow light, a YAG phosphor is well known. The yttrium aluminum garnet (YAG) phosphor is obtained by doping YAG with rare earth elements. There has also been known a method in which in stead of using the YAG phosphor, a red light emitting phosphor and a green light emitting phosphor are mixed, to thereby obtain white light through additive color mixture of blue, red, and green. As regards a phosphor for converting blue light into green light or into red light with relatively high efficiency, a chalcogenide phosphor and a phosphor nitride which are doped with rare earth are well known. There has also been disclosed an LED display device in which a plurality of light emitting elements which emit light of wavelength shorter than the wavelength of blue light are arranged on a print board of a predetermined shape and area having a circuit formed thereon, and each of the light emitting elements is covered with a translucent resin which contains a wavelength conversion material.

There has also been disclosed a method, for example, in JP 3417384 B, in which a transparent film containing a wavelength conversion material is arranged between a light guide plate of a backlight and an LCD panel, rather than potting a blue LED with a wavelength conversion material, to thereby produce white light.

When at least two kinds of phosphors each emitting light such as green light, red light, or yellow light through excitation of blue light or ultraviolet light are used together with a blue LED so as to perform additive color mixture, it is possible to attain an LCD module excellent in color reproducibility. However, according to a structure in which a red phosphor and a green phosphor are mixed to be applied onto a transparent film as disclosed in relation to a conventional technology, light emitted from the green phosphor is used to excite the red phosphor, or an in-plane particle density increases, which leads to a problem in that it is difficult to attain high luminance.

Meanwhile, according to additive mixture of two colors respectively obtained from a blue LED and a YAG phosphor (so-called "pseudo white LED" structure), light components with a wavelength range of 600 nm or more are scarce, which hinders realization of an LCD module excellent in color reproducibility. In general, according to a current color filter technology, it is regarded as being extremely difficult to exceed the NTSC ratio of 100% by using the pseudo white LED as a light source.

A conventional backlight employing a white LED is used in combination with an LCD panel. However, an optimal color balance of the backlight is different depending on the optical system of the LCD panel. It is difficult to adjust colors of the backlight for individual LCD panel by controlling an additive amount of phosphors to be potted into the LED. In the existing circumstances, the color balance of the backlight is adjusted by ranking the chromaticity of a certain block in variation of mass production. Accordingly, it is not always possible to obtain a light source of optimal chromaticity.

SUMMARY OF THE INVENTION

In view of the above-mentioned circumstances, the present invention provides a lighting device, which surface-emits light emitted from a light emitting element by using a light guide member. The lighting device includes: a first wavelength conversion member which is provided in an optical path between the light emitting element and a light emitting surface of the lighting device; and a second wavelength conversion member which is provided in an optical path between the first wavelength conversion member and the light emitting surface of the lighting member. According to this structure, light emitted by the second wavelength conversion member has a wavelength shorter than that of light emitted by the first wavelength conversion member. In this case, a description is given on the assumption that the first wavelength conversion member is a red phosphor which emits red light through excitation of blue light and the second wavelength conversion member is a green phosphor which emits green light through excitation of blue light. In other words, the lighting device includes: a red phosphor which is provided in an optical path between the blue light emitting element and the light emitting surface of the lighting device; and a green phosphor which is provided in an optical path between the red phosphor and the light emitting surface of the lighting member. With this structure, blue light emitted by the blue light emitting element and red light obtained through the conversion in the red light emitting phosphor are mixed together to produce violet light, and the violet light is further mixed with green light obtained through the conversion in the green light emitting phosphor through blue light excitation, to thereby produce white light. When the white light is produced in the light conversion order as described above, it is not necessary to use light emitted from the green phosphor as exciting light for exciting the red phosphor, which increases light emitting efficiency of the lighting device. Further, the green light emitting phosphor is completely separated from the blue light emitting element, and therefore the green light emitting phosphor and the light emitting element do not chemically affect each other, which leads to an improvement in temperature-luminance characteristics and reliability of the lighting device. It also makes it easy to independently adjust the chromaticity of individual lighting device.

In the aforementioned structure, the red light emitting phosphors may be dispersed in the resin potting the blue light emitting element. It is also possible to provide one of a yellow phosphor and a second red phosphor between the red phosphor and the green phosphor.

Alternatively, the lighting device of the present invention includes: a blue light emitting element; a first color conversion member for converting light into red light through blue light excitation; and a second color conversion member, which is provided independently of the first color conversion member, for converting light into green light through blue light excitation, in which the first color conversion member and the second color conversion member are arranged in an optical path between the light emitting element and a light emitting surface of the lighting device, in a manner that makes a distance between the first color conversion member and the light emitting element shorter than a distance between the second color conversion member and the light emitting element.

Further, a display device according to the present invention includes: a lighting device of any one of the aforementioned structures; and a display element of a non-self light emission type which is provided on an irradiation surface side of the lighting device.

Alternatively, the display device according to the present invention includes: a blue light emitting element; a display element of a non-self light emission type; a light guide member for emitting, from a light exiting surface thereof, light incident from the blue light emitting element, towards the display element; a red light emitting phosphor provided in an optical path between the blue light emitting element and the display element; and a green light emitting phosphor provided in an optical path between the red light emitting phosphor and the display element. Further, one of a second red light emitting phosphor and a yellow light emitting phosphor is provided between the red light emitting phosphor and the green light emitting phosphor.

DETAILED DESCRIPTION OF THE PREFERRED EMBODIMENTS

The present invention relates to a lighting device, which surface-emits light, which is emitted from a light emitting element, by using a light guide member. In the light emitting device, a plurality of wavelength conversion members each for performing wavelength conversion to convert light emitted from the light emitting element into light having peak wavelengths different from one another. The plurality of wavelength conversion members are arranged in such a manner that the peak wavelengths obtained from the respective wavelength conversion members decrease as the distance between the light emitting element and each of the wavelength conversion member increases. In this structure, of the plurality of wavelength conversion members, a first wavelength conversion member is included in a first layer and a second wavelength conversion member is included in a second layer. The first layer and the second layer are formed on a film, and the film is arranged on a light emitting surface side of the light guide member. Alternatively, of the plurality of wavelength conversion members, the first wavelength conversion member is provided between the light emitting element and the light guide member, and the second wavelength conversion member is provided to the light guide member. In providing the second wavelength conversion member to the light guide member, the second wavelength conversion member may be dispersed in the light guide member, the second wavelength conversion member may be applied on a surface of the light guide member, or the second wavelength conversion member may be dispersed in the film to be affixed onto a surface of the light guide member.

The present invention further relates to another lighting device, which surface-emits light, which is emitted from a light emitting element, by using a light guide member. The light emitting device includes: a first wavelength conversion member for performing wavelength conversion to convert light emitted from the light emitting element into light having a first peak wavelength; and a second wavelength conversion member for performing wavelength conversion to convert light emitted from the light emitting element into light having a wavelength shorter than the first peak wavelength, in which the first wavelength conversion member and the second wavelength conversion member are arranged in such manner that a distance between the first wavelength conversion member and the light emitting element is smaller than a distance between the second wavelength conversion member and the light emitting element. In this structure, a first layer including the first wavelength conversion member and a second layer including the second wavelength conversion member are formed on a film, and the film is provided on a light emitting surface side of the light guide member or between the light emitting element and the light guide member. Alternatively, the first wavelength conversion member may be included in a resin potting the light emitting element. In this case, the second wavelength conversion member may be included in the light guide member or may be provided on the light emitting surface side of the light guide member.

Further, a resin layer, in which transparent beads of acrylic or silica is dispersed, is provided on the light emitting surface side of the light guide member such that the resin layer is provided outside of the second wavelength conversion member so as to be close to the light emitting surface. The transparent beads provide a light-scattering function to the lighting device. The transparent beads may be used as being mixed with the second wavelength conversion member.

As the light emitting element, one of a blue light emitting element having a peak wavelength ranging from 450 nm to 480 nm and an ultraviolet light emitting element having a peak wavelength ranging from 360 nm to 480 nm may be used. As the first wavelength conversion member, there may be used a red phosphor which converts light into red light through excitation of blue light. As the second wavelength conversion member, there may be used a green phosphor which converts light into green light through excitation of blue light. Further, a second red phosphor or a yellow phosphor which converts the light from the light emitting element into yellow light through excitation of the light is provided between the red phosphor and the green phosphor. Alternatively, the second red phosphor or the yellow phosphor may be provided on a film in which the green phosphor is provided. In other words, as long as the green light emitting phosphor and one of the second red phosphor and the yellow phosphor are separated from the blue light emitting element and the red light emitting phosphor, the green light emitting phosphor may be dispersed in the light guide member, may be dispersed in a film provided to a light exiting surface of the light guide member, or may be dispersed in a resin provided on a film which is provided to a light exiting surface of the light guide member. As described above, according to a structure in which the second red phosphor or the yellow phosphor is provided between the red phosphor and the green phosphor, it is possible to obtain irradiation light at any desired tone of color by adjusting an amount of the second red phosphor or the yellow phosphor to be mixed and an amount of green phosphor to be mixed, without adjusting an amount of the red phosphor to be mixed and a tone thereof.

As the green light emitting phosphor for converting light into green light through excitation of blue light, a phosphor having luminance efficiency equal to or higher than that of the YAG phosphor is suitably used. Examples of the phosphor having luminance efficiency equal to or higher than that of the YAG phosphor include a phosphor composed of group II metal thiogallate and a rare-earth dopant, a phosphor composed of an oxide and a rare-earth dopant, and a phosphor composed of Sr—SION and a rare-earth dopant. As the red light emitting phosphor for converting light into red light through excitation of blue light, a phosphor composed of a nitride and a rare-earth dopant, or a phosphor composed of sulfide and a rare-earth dopant is suitably used.

Grains of the red phosphor are coated with a transparent material impermeable to water, or a phosphor nitride is used as the red phosphor, to thereby increase reliability of a package. As the transparent material impermeable to water, it is possible to use $SiO_2$, a silicon resin, a cycloolefin resin, a fluorinated resin, or an epoxy resin. In the case of using the phosphor nitride, it is not necessary to apply a coat on the phosphor.

When the first layer containing the first wavelength conversion member and the second layer containing the second wavelength conversion member are formed in a film and the film is provided between the light emitting element and the light guide member, a transparent resin is provided between the film and at least one of the light emitting element and the light guide member.

Further, the film may be obtained by joining a pair of two films through an adhesive layer containing the second wavelength conversion material. In addition, the adhesive layer is provided with an area, on the peripheral portion of the film, which does not contain the second wavelength conversion material. This structure prevents deterioration of the wavelength conversion material. The film is tucked in so that the peripheral area of the adhesive layer that does not contain the second wavelength conversion material locates outside of an optical path of light emitted by the light emitting element. The film, which may be provided on a light exiting surface of the light guide plate, may be bent so as to wrap the light guide plate except for a light entrance surface. The film may also be provided between the light emitting element and the light guide plate so as to cover the light emitting element. A reflecting layer may be provided in the area that does not contain the second wavelength material, to thereby guide light into the light guide member with more efficiency. In the case where the film is tucked in so as to cover the light emitting element, the film is arranged such that the light exiting surface of the film is not orthogonal or parallel to an incident direction of light from the light emitting element.

The film may also have a structure, in which transparent lenses in a dorm shape or in an elongated dorm shape are arranged in a matrix outside of the second layer so as to be close to the light exiting side.

Further, a display device of the present invention includes: a lighting device of any one of the aforementioned structures; and a display element of a non-self light emission type which is provided on an irradiation surface side of the lighting device. In other words, there is provided a display device in which a display element of a non-self light emission type is illuminated by using light emitted from the light emitting device, which includes: a first wavelength conversion body which converts light from the light emitting element into light having a first peak wavelength through excitation; and a second wavelength conversion member for converting light from the light emitting element into light having a wavelength shorter than the first peak wavelength, the first wavelength conversion member and the second wavelength conversion member being separated from each other, the first wavelength conversion member and the second wavelength conversion member being arranged such that a distance between the first wavelength conversion member and the light emitting element is smaller than a distance between the second wavelength conversion member and the light emitting element. Alternatively, the display device includes: a blue light emitting element; a display element of a non-self light emission type; a light guide member for emitting, through a light exiting surface thereof, light incident from the blue light emitting element, towards the display element; a red light emitting phosphor provided in an optical path between the blue light emitting element and the display element; and the green light emitting phosphor provided in an optical path between the red light emitting element and the display element. The display device of the aforementioned structure is high in luminance and excellent in the reproducibility of color, to thereby attain high display quality.

EXAMPLE 1

Figure 1:
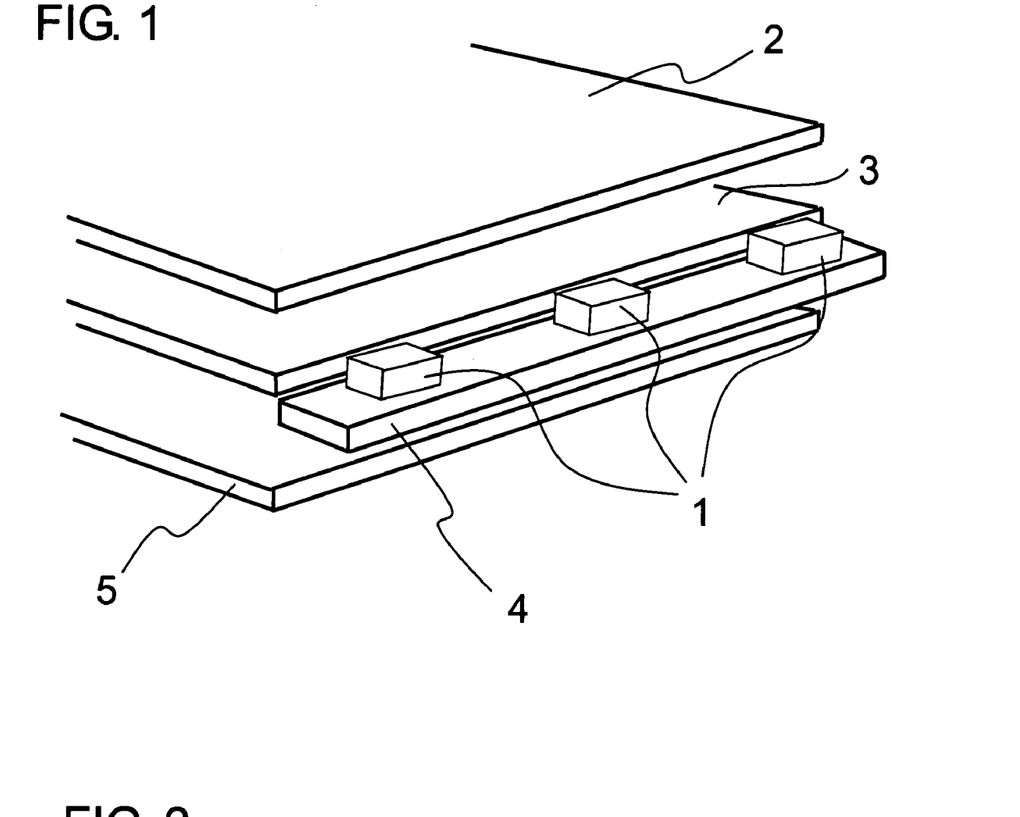
FIG. 1 is a perspective view schematically illustrating a structure of a lighting device according to the present invention.
Figure 5:
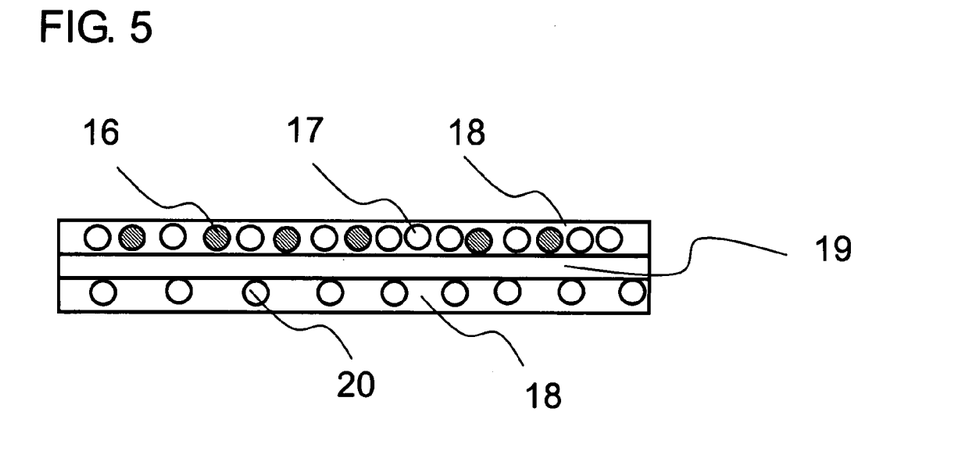
FIG. 5 is a cross-sectional view schematically illustrating a structure of a fluorescent film used in an example of the present invention.

A lighting device of Example 1 is described with reference to FIGS. 1 and 5. FIG. 1 is a schematic diagram illustrating an outline of the lighting device according to the present invention, and FIG. 5 is a cross-sectional diagram schematically illustrating a structure of a fluorescent film 2. In Example 1, a light emitting diode package 1 is a package for emitting blue light, in which a blue LED element is potted in a resin. As shown in FIG. 1, the light emitting diode package 1 is mounted by being soldered onto a terminal area on a circuit board 4. The light emitting diode package 1 emits one of blue light and ultraviolet light having a spectrum with a peak wavelength ranging from 360 nm to 480 nm. The light emitted from the light emitting diode package 1 is repeatedly reflected and refracted between a light guide member 3 and a reflecting plate 5, so as to be uniformly emitted through a light exiting surface of the light guide member 3. The light emitted from the light guide member 3 passes through the fluorescent film 2, in which the light is subjected to additive color mixture to be converted into white light. In this case, it is general that the circuit board 4 employs a flexible print board or a glass epoxy board, the light guide member 3 employs, as a material thereof, polycarbonate, acrylic, etc., and the reflecting plate 4 employs a film obtained by providing a silver layer or an aluminum layer to a transparent film. However, silver is disposed to absorb blue light, and aluminum does not have a high reflective property. Therefore, the use of silver or aluminum as the reflecting plate 5 of the present invention results in a decrease of luminance. Accordingly, it is preferable to use an ESR manufactured by Sumitomo 3M Limited or a white PET film as the reflecting plate 5. The term "ESR" is an abbreviation of "Enhanced-Specular-Reflector" and refers to a film having a high reflectance in a range of visible wavelengths due to a multi-layer film structure using a polyester resin. The ESR has been developed for a reflecting sheet provided below the light guide plate of a backlight. The ESR causes little losses when reflecting light, and therefore it is possible to effectively use a light source, to thereby significantly improve a screen luminance.

FIG. 5 is a cross-sectional view schematically illustrating a structure of the fluorescent film 2. An upper surface (a light emitting surface) of a transparent base material 19 which is made of, for example, PET, polycarbonate, acrylic, or zeonor, is applied with a transparent resin 18 and the resin is cured. The transparent resin 18 has transparent diffusion beads 17 of silica etc. and the green phosphor grains 16 dispersed therein. On the other hand, a lower surface (a surface facing the light guide member) of the transparent base material 19 is applied with a transparent resin 18 in which the red phosphor grains 20 are dispersed, and the resin is cured. Alternatively, yellow phosphor grains such as YAG may be used in place of the red phosphor grains 20, or the red phosphor grains 20 and the yellow phosphor grains may be mixed together to be provided. The red phosphor grains 20 may employ chalcogenide chemical compound phosphor micro grains. In particular, a fluorescent material composed of sulfide such as CaS an SrS and a rare-earth dopant and another fluorescent material composed of a phosphor nitride and a rare-earth dopant are both excellent in light conversion efficiency. It should be noted, however, that in a case of using the phosphor sulfide as the red phosphor grains 20, the phosphor sulfide may react with moisture to generate hydrogen sulfide. In this case, a chemical reaction is caused in the reflection film within the LED, which significantly impairs the luminance characteristics. Therefore, in a case of using a phosphor sulfide, it is necessary to directly cover the entire phosphor with a transparent impermeable material such as $SiO_2$. As examples of the green phosphor grains 16, an oxide phosphor and strontium-thiogallate activated by rare earth are widely known, and may be suitably used. In a case where the light source emits light substantially similar to ultraviolet light, the green phosphor grains 16 made of $BaMgAl_{10}O_{17}$:Eu, Mn, or ZnS are suitably used.

An amount of energy increases as a wavelength of light becomes short. Therefore, in terms of an excitation wavelength of a phosphor, an energy amount on a shorter wavelength side is larger. Accordingly, a phosphor having a long light emission wavelength often has a long excitation wavelength, as compared with a phosphor having a short light emission wavelength. For example, in Example 1, in a case of using CaS for the red phosphor and $SrGa_2S_4$ for the green phosphor, when two kinds of those phosphors are used in combination, light emitted from $SrGa_2S_4$ is used in excitation for emitting red light because the excitation wavelength of CaS ranges from 500 nm to 600 nm, which results in a decrease of luminance. According to the present invention, the phosphors are arranged in an order such that the excitation wavelength of each phosphor decreases as the distance between the phosphor and the light source increases, to thereby eliminate a situation where a light emission wavelength from a phosphor is used for excitation, which makes it possible to provide, as a result, a lighting device capable of using energy with high efficiency.

EXAMPLE 2

Figure 6:
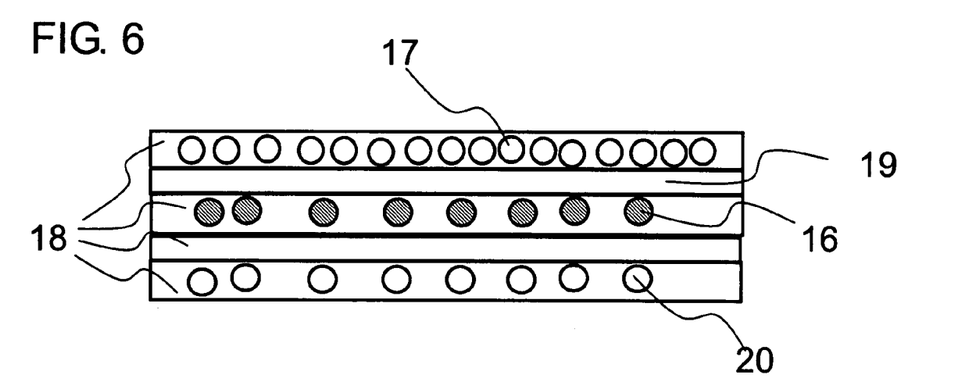
FIG. 6 is a cross-sectional view schematically illustrating a structure of a fluorescent film used in another example of the present invention.

Example 2 is described with reference to FIGS. 1 and 6. Example 2 is different from Example 1 in terms of a layer structure of the fluorescent film 2. In Example 1, the resin in which the green phosphor grains 16 and the transparent diffusion beads 17 are mixed and the red phosphor grains 20 are arranged so as to interpose the transparent film 19. According to Example 2, the green phosphor grains 16 and the transparent diffusion beads 17 are separated from each other, and the green phosphor grains 16 and the red phosphor grains 20 are provided so as to interpose a transparent resin 18. That is, as shown in FIG. 6, the transparent resin 18 in which the transparent diffusion beads 17 are mixed is applied and cured on an upper surface the transparent film 19 such as PET. Another transparent resin 18 in which the green phosphor grains 16 are mixed is applied and cured on another surface of the transparent film 19 opposite to the upper surface. Further, on the transparent resin 18 in which the green phosphor resin grains 16 are mixed, a resin in which no phosphor is mixed is applied and cured, on which a transparent resin 18 having the red phosphor grains 20 mixed therein is applied and cured. Blue light that has passed through the light guide member 3 first encounters the red phosphor grains 20 to be partially converted into red light, and then encounters the green phosphor grains 16 to be partially converted into green light, to thereby produce white light. With this structure, as compared with Example 1, green light and red light are easily mixed because of the high light diffusion efficiency. Further, it is easy to laminate a third phosphor through a transparent resin, because the green phosphor grains 16 and the red phosphor grains 20 are arranged so as to interpose a transparent resin. In Example 2, only two kinds of phosphors are used, but it is also possible to employ a multilayer structure including three or more kinds of phosphors. Formation of phosphors in multiple layers on a single film increases light transmission. However, in a case where it is difficult to form phosphors in multiple layers for manufacturing reasons, a plurality of films may be prepared and arranged in such an order that the excitation wavelength of each film decreases as the distance from the light source to the film increases, to thereby obtain the same effect.

EXAMPLE 3

Figure 2:
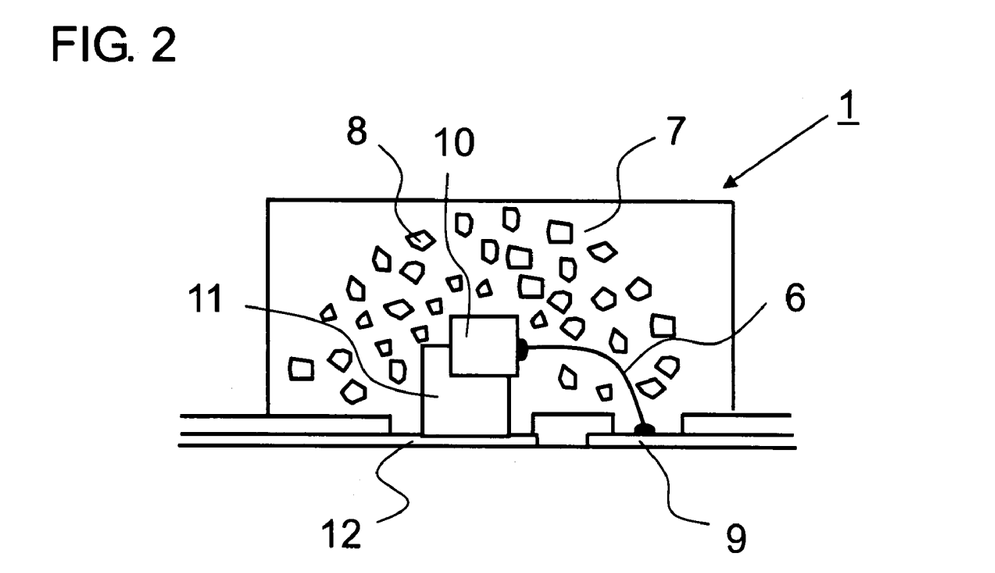
FIG. 2 is a cross-sectional view schematically illustrating a structure of a light source of the lighting device according to the present invention.

A lighting device according to Example 3 is described with reference to FIGS. 1 and 2. FIG. 2 is a cross-sectional diagram schematically illustrating a structure of the light emitting diode package 1. Example 3 is different from the aforementioned Examples 1 and 2 in terms of the structure of the light emitting diode package 1. As shown in FIG. 2, the light emitting diode package 1 is structured such that the blue LED element 10 is potted in a resin 7 in which the red phosphor grains 8 are dispersed. As shown in FIG. 1, the light emitting diode package 1 is mounted by being soldered onto a terminal area on the circuit board 4. Therefore, blue light emitted by the blue LED element 10 and red light converted from the blue light through the red phosphor grains 8 exit from the light emitting diode package 1. In other words, the light emitting diode package 1 emits light having a spectrum which includes two wavelengths having peaks each ranging from 450 nm to 480 nm and ranging from 600 nm to 680 nm, respectively. Violet light emitted from the light emitting diode package 1 is repeatedly reflected and refracted between the light guide member 3 and a reflecting plate 5, so as to be uniformly emitted through a light exiting surface of the light guide member 3. As shown in FIG. 1, the light exiting surface of the light guide member 3 is provided with a green light emitting diffusion film serving as the fluorescent film 2. The light emitted from the light guide member 3 passes through the green light emitting diffusion film, in which the light is subjected to additive color mixture to be converted into white light. The green light emitting diffusion film has a function of converting blue light into green light and a function of diffusing light. For example, examples of the green light emitting diffusion film include a film obtained by eliminating the transparent resin including the red phosphor grains 20 from the film structure of FIG. 5, and a film obtained by eliminating the transparent resin 18 including the red phosphor grains 20 and the transparent resin joining the transparent resin 18 from the film structure of FIG. 6. That is, it is possible to use a film obtained by providing a transparent resin 18, in which a transparent diffusion beads 17 of silica etc. and the green phosphor grains 16 are dispersed, on an upper surface (a light emitting surface) of the transparent base material 19 made of, for example, PET, polycarbonate, acrylic, or zeonor, or a film obtained by providing a transparent resin 18, in which the transparent diffusion beads 17 are mixed, on an upper surface of a PET film 19 while providing another transparent resin 18, in which the green phosphor grains 16 are mixed, to a surface opposite to the upper surface.

As shown in FIG. 2, a conductive base 11 is electrically joined to electric wiring 12 through conductive paste or solder, and the blue LED element 10 of InGaN system or GaN system is electrically joined to the conductive base 11 through conductive paste. The conductive base 11 is used for the purposes of, for example, ensuring the electric joint between the blue LED element 10 and the electric wiring 12, improving thermal conductivity, and adjusting the height of the conductive base 11 from the circuit board 4. The conductive base 11 is not always necessary as long as those conditions are satisfied. The blue LED element 10 has two electrodes (not shown) formed for current injection. One of the electrodes is electrically joined with first electric wiring 9 through wire 6, and the other electrode is electrically joined with second electric wiring 12 through the conductive base 11. In a case of not using the conductive base 11, the electrodes are each electrically joined with the first electric wiring 9 and the second electric wiring 12, respectively, through the wire 6. The wire 6 may employ gold wire, which is used in normal wire bonding. In any of those cases, the electric wiring is electrically joined with an electrode provided on a board for connection. On each of the electrodes, a protection film such as an insulating film is provided, except for a conducting portion of the electrode.

A translucent impermeable material 7 covers the blue LED element 10, the conductive base 11, and a part or the whole of the wire 6. In the translucent impermeable material 7, the red phosphor grains 8 are mixed at a predetermined concentration. As the impermeable material 7, a polymer material such as a silicon resin, a cycloolefin resin, or a fluorine resin maybe used. It is possible to selectively use one of the resins, or to use a plurality of resins as a hybrid. Those translucent materials do not always need to be transparent as long as being translucent, and therefore an epoxy material is also widely used. As the red phosphor grains 8, chalcogenide chemical compound phosphor micro grains may be used. In particular, a fluorescent material composed of sulfide such as CaS an SrS and a rare-earth dopant and another fluorescent material composed of a phosphor nitride and a rare-earth dopant are both excellent in light conversion efficiency. It should be noted, however, that in a case of using the phosphor sulfide as the red phosphor grains 8, the phosphor sulfide may react with moisture to generate hydrogen sulfide. In this case, a chemical reaction is caused in the reflection film within the LED, which significantly impairs the luminance characteristics. Therefore, in a case of using a phosphor sulfide, it is necessary to directly cover the entire phosphor with a transparent impermeable material such as $SiO_2$.

The red phosphor grains 8 are mixed at a predetermined rate into the impermeable material 7, and the blue LED element 10 is covered with the impermeable material 7 as shown in FIG. 2. With this structure, blue light from the blue LED element 10 of InGaN system or of GaN system is additively mixed with red light generated through wavelength conversion of the blue light, to thereby make it possible to obtain a luminescent color having a desired chromaticity. A color reproduction range based on the luminescent color may be arbitrarily controlled by adjusting a mixture ratio of the red phosphor grains 8, a grain size of respective phosphor grains, and an intensity of blue light to be applied. For example, with regard to the mixture ratio, the red phosphor gains 8 are mixed into a resin having a thickness of 60 to 70 μm at a weight ratio of about 50%, to thereby obtain light (violet light) of a chromaticity coordinate in the vicinity of x=0.35y=0.18. In this case, there is a tendency that x and y have smaller values as the intensity of the blue light is increased, while x and y have greater values as the intensity of blue light is decreased. However, the change is about ±0.02 at most, which is small enough to have an effect. With the high mixture rate of the red phosphor grains 8, when transparent beads of silica etc. are further mixed to be dispersed into the impermeable material 7, the dispersiveness of the phosphor grains are increased, to thereby improve light emitting efficiency.

Figure 7:
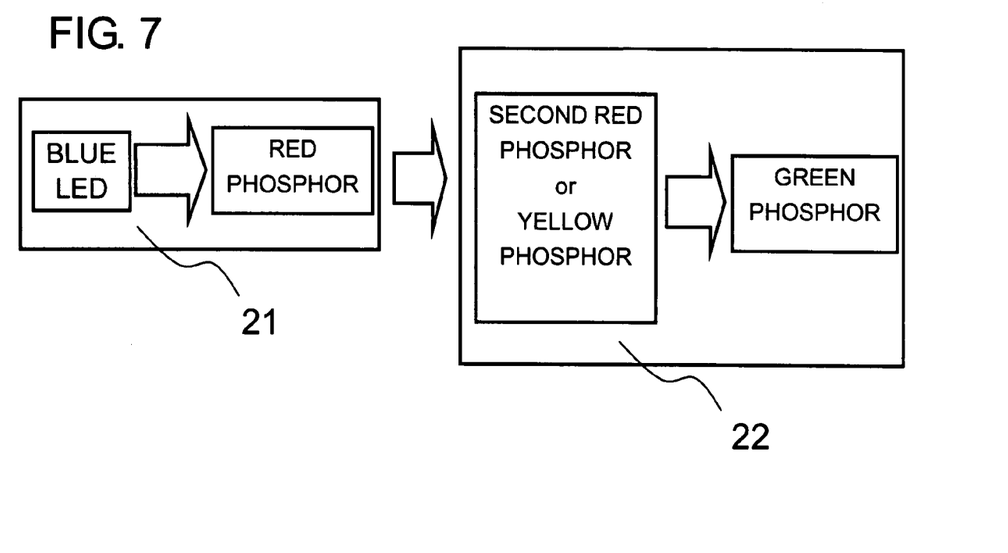
FIG. 7 is a flow diagram for explaining a color conversion order according to the present invention.

FIG. 7 is a flow diagram of a color conversion according to the present invention. Blue light is converted, in a light emitting diode package 21, into red light by, for example, Ca(Sr)S:Eu or a phosphor nitride. Violet light, which is obtained by mixing blue light and red light and is emitted from the light emitting diode package 21, includes red components which are further increased by a second red phosphor arranged close to the blue LED element in a fluorescent film 22, and the violet light is finally turned into white light through the green phosphor. The second red phosphor may employ, for example, Ca(Sr)S:Eu, or a phosphor nitride. Alternatively, a YAG phosphor activated by Ce may be employed as a yellow light emitting phosphor, to thereby shifting the light color into a yellowish color. As the green phosphor, strontium-thiogallate etc. activated by rare earth are widely known, and suitably used. With the aforementioned structure, a color tone of emitted light can be arbitrarily adjusted based on the mixture ratio between the red phosphor and the green phosphor to be applied to the fluorescent film 2, without adjusting a color tone of light emitted from the light emitting diode package 21. Further, the color conversion order according to the present invention is not limited to a case of blue color excitation, and is also effective in a case of performing the excitation by ultraviolet light of, for example, about 300 nm to 420 nm. Further, two films may be individually prepared, one of which is applied with the second red phosphor, and the other one of which is applied with the green phosphor, and the films are arranged independently of each other. Alternatively, the second phosphor may be printed on the light guide member or kneaded into the light guide member, and the green phosphor may be applied onto a film, to thereby obtain the same effect.

Figure 3:
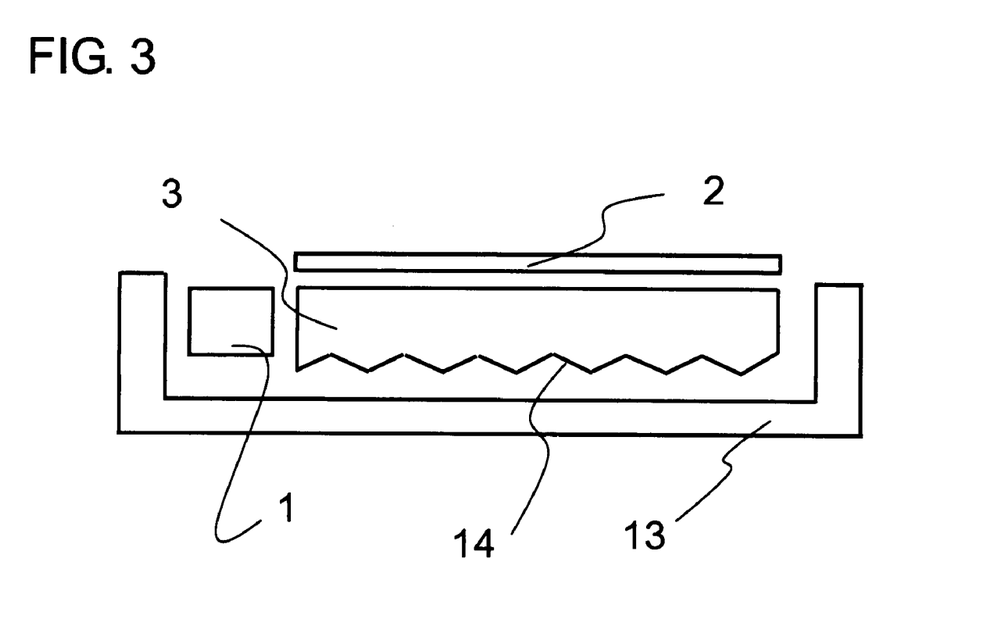
FIG. 3 is a cross-sectional view schematically illustrating an entire structure of a lighting device according to the present invention.

FIG. 3 schematically illustrates an entire structure of the lighting device according to Example 3. The light emitting diode package 1 of a structure shown in FIG. 2 is turned on so as to emit light into the light guide member 3. The light that has entered the light guide member 3 uniformly exits from an upper portion of the cross-sectional view due to a prism 14 designed with an optimal angle and height. This blue light is partially excited when passing through the fluorescent film 2, to thereby exit as green light. Accordingly, it is possible to obtain white light through an additive mixture of three colors of blue, red, and green, or of four colors of blue, red, green, and yellow. The light guide member and the light source are accommodated in a frame 13. Blue light first encounters a red phosphor as a first phosphor and finally encounters a green phosphor to avoid a situation where green light emission is used for exciting the red phosphor or the yellow phosphor, to thereby improve light emitting efficiency of the lighting device.

Figure 4:
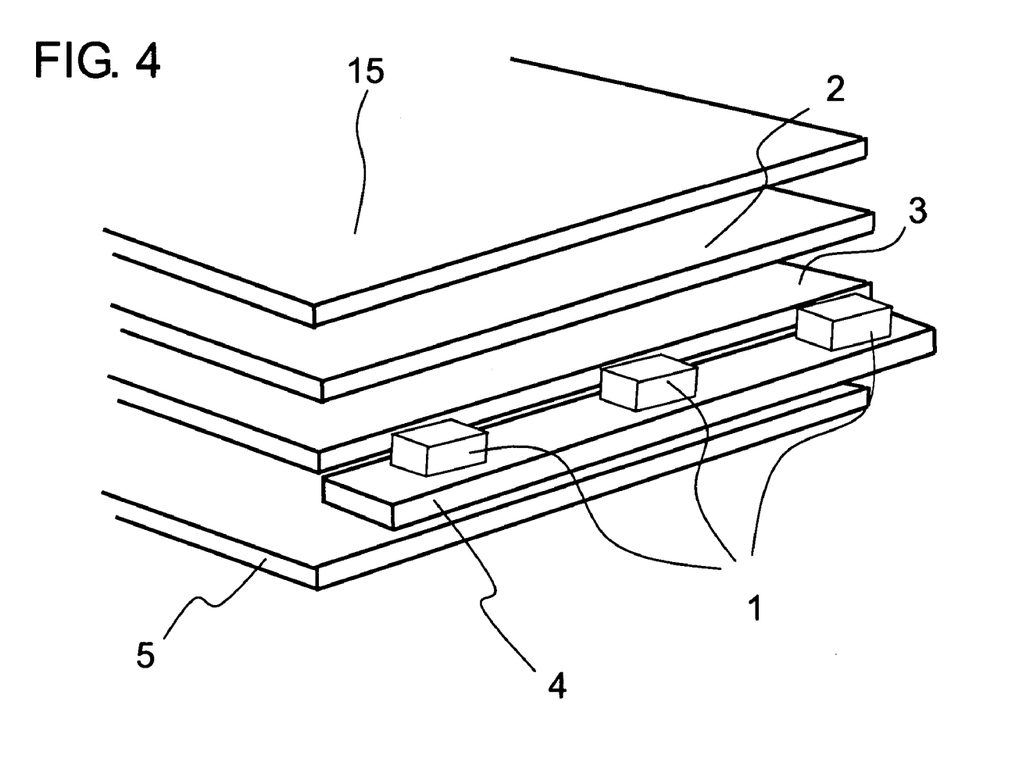
FIG. 4 is a perspective view schematically illustrating a structure of a liquid crystal display device according to the present invention.

FIG. 4 schematically illustrates a structure of a liquid crystal display device using the lighting device of the aforementioned structure. As shown in FIG. 4, a liquid crystal panel 15 is arranged on a light emitting surface of the lighting device. The liquid crystal panel 15 includes a color filter subjected to color tuning according to a light source spectrum of light emitted by the lighting device. Alternatively, a plurality of wavelength conversion members are provided in accordance with a light emission color of the light source package and with the color filter of the liquid crystal panel. With this structure, it is easy to realize a liquid crystal display device of extremely high luminance having an excellent color reproducibility.

EXAMPLE 4

Figure 8:
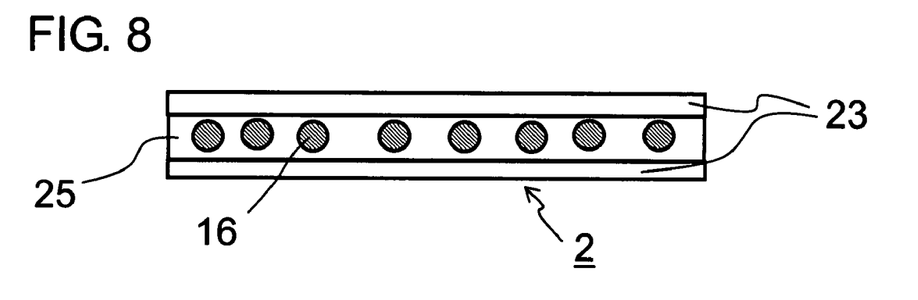
FIG. 8 is a cross-sectional view schematically illustrating a structure of a fluorescent film used in further another example of the present invention.

FIG. 8 schematically illustrates a cross-sectional structure of the fluorescent film 2 used in Example 4. The structure except for the fluorescent film 2 is similar to that of Example 3. Therefore, a redundant description is omitted accordingly. In other words, violet light exiting from the light emitting diode package 1 is repeatedly reflected and refracted between the light guide member 3 and the reflection plate 5, to thereby uniformly exit from a light exiting surface of the light guide member 3.

As shown in FIG. 8, the fluorescent film 2 of Example 4 is obtained by laminating the green phosphor grains 16 with two moisture-proof films 23 through an adhesive layer 25. Examples of the green phosphor grains 16 include, similarly to the other examples, an oxide phosphor and strontium-thiogallate activated by rare earth. In particular, a phosphor sulfide is characterized by being susceptible to moisture, so it is effective to laminate the phosphor with a moisture-proof film as in Example 4. The moisture-proof film may include a zeonor film or a film obtained by evaporating a metal film made of, for example, silicon oxide or alumina onto PET, or may adopt a structure in which transparent films are multi-layered so as to increase an interface area in order to suppress moisture permeability. The moisture-proof film is required to have characteristics such as a high degree of transparency, a low refractive index (preferably close to the index of air as much as possible), and low moisture permeability. As long as the moisture-proof film satisfies those characteristics, any structure may be adopted. A material through which the moisture-proof film is laminated may include an adhesive for optics application or a hot-melt adhesive. Any material having a high transparency and adhesion property may be used as the material through which the moisture-proof film is laminated.

Figure 9:
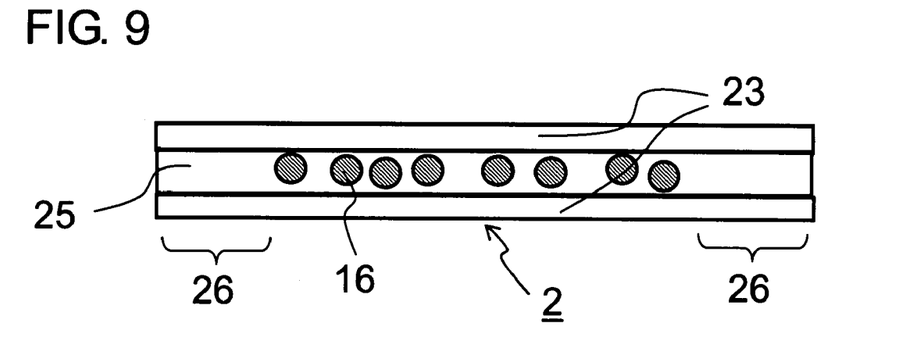
FIG. 9 is a cross-sectional view schematically illustrating a structure of a fluorescent film used in further another example of the present invention.
Figure 10:
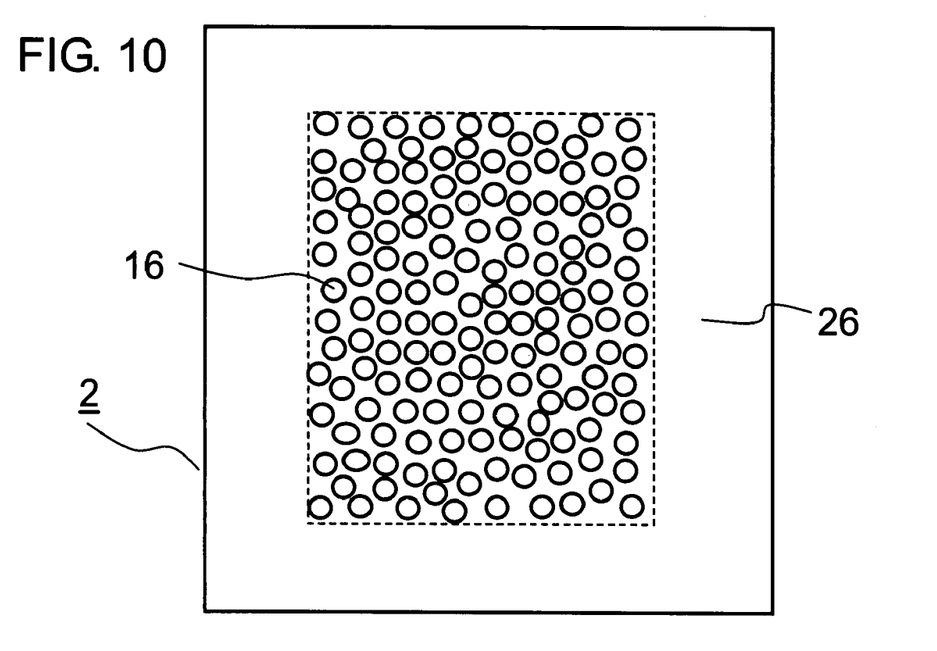
FIG. 10 is a plan view schematically illustrating a structure of a fluorescent film used in further another example of the present invention.

Further, the light emitting portion (fluorescent area) is provided with an area where no phosphor exist (hereinafter, referred to as "non-light emitting area") on the peripheral portion towards the contour, which improves reliability of the device. FIG. 9 is a cross-sectional view of the fluorescent film 2 which is provided with a non-light emitting area on the peripheral portion thereof, and FIG. 10 is a top perspective view of the fluorescent film 2. As shown in FIGS. 9 and 10, the green phosphor grains 16 are laminated by two moisture-proof films 23 through the adhesive layer 25, in which a non-light emitting area 26 is provided on the peripheral portion of the fluorescent film 2. Without the non-light emitting area 26, moisture easily permeates into the phosphor through the adhesive layer provided to a side surface of the film, leading to a deterioration of the phosphor. In other words, there is provided a distance from the contour to the phosphor area as long as possible, thereby making it possible to improve reliability in terms of keeping away moisture from the device.

Figure 11:
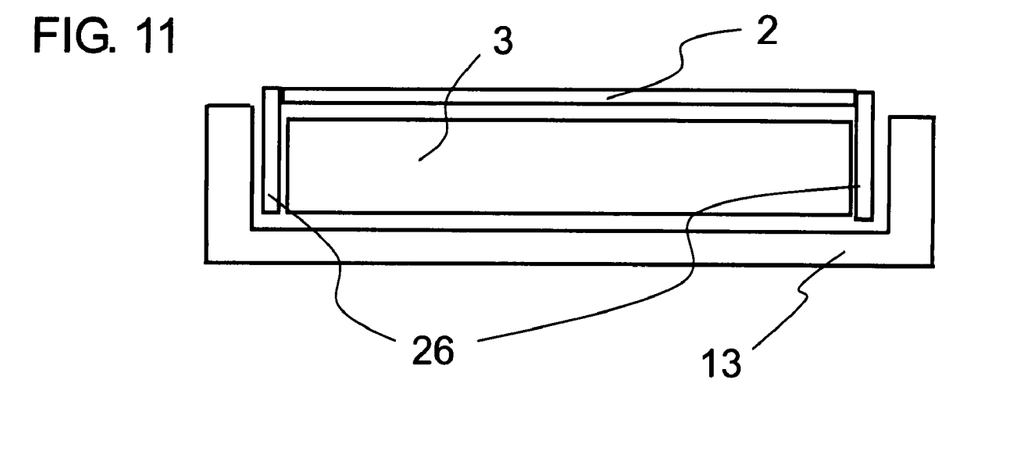
FIG. 11 is a cross-sectional view schematically illustrating a structure of a lighting device according to another example of the present invention.

However, there is a market demand, concerning most of the display devices, that an area other than a display area should be reduced to minimum, and the devices are contested in trimming the frame as much as possible. In view of this, when adopting a film having a large non-light emitting area 26, the non-light emitting area 26 may be tucked, for example, in an edge of the light guide plate. FIG. 11 illustrates a structure of the lighting device in which the non-light emitting area 26 is tucked in. As shown in FIG. 11, the non-light emitting area 26 is tucked into a surface side of the light guide plate parallel to a light entrance direction from the light emitting diode, to thereby make it possible to secure a large area for the non-light emitting area 26 while maintaining optical characteristics.

EXAMPLE 5

Figure 12:
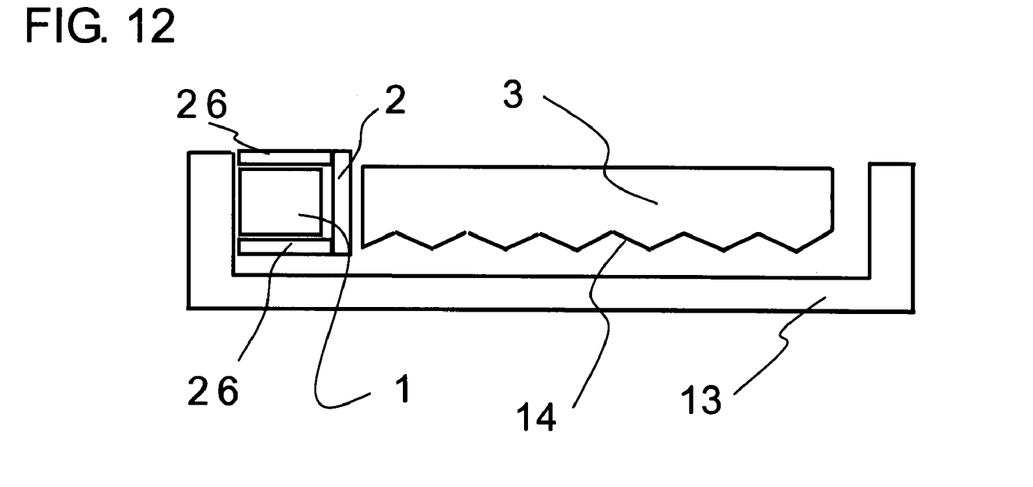
FIG. 12 is a cross-sectional view schematically illustrating a structure of a lighting device according to further another example of the present invention.

The lighting device according to Example 5 is described with reference to FIG. 12 and FIG. 13. Similarly to Example 3, in the light emitting diode package 1, the blue LED element 10 is potted in the resin 7 in which the red phosphor grains 8 are dispersed. Example 5 is different from Example 4 in terms of the arrangement of the fluorescent film 2. FIG. 12 illustrates a structure in which the fluorescent film 2 is arranged as being adjacent to the light emitting diode package 1. In this manner, blue light is subjected to color conversion before entering the light guide member 3, to thereby produce an effect of reducing short wavelength components and suppressing attenuation due to reflection and refraction. Further, as described above, the non-light emitting area 26 is provided and tucked in, to thereby attain a compact functional design without impairing reliability. The non-light emitting area 26 may be provided with a reflecting layer through evaporation of a metal film or provided with white ink, to thereby make it possible to improve efficiency to emit light into the light guide member 3. In FIG. 12, the non-light emitting area 26 is tucked in a direction toward the light emitting diode package 1. However, the non-light emitting area 26 may also be tucked into a direction toward the light guide member 3. It is also possible that the non-light emitting area 26 is tucked into the light guide member side at one end, while the other end of the non-light emitting area 26 is tucked into the light emitting diode package 1 side. In a case of FIG. 12, an air space exists between the fluorescent film 2 and the light guide member 3, which impairs light entrance efficiency with respect to the light guide member 3, due to refractive index differences. In view of this, a transparent resin such as silicon rubber, which has a refractive index closer to those of the fluorescent film 2 and the light guide member 3, may be interposed between the fluorescent film 2 and the light guide member 3, to thereby make it possible to improve luminance efficiency. The transparent resin may preferably be capable of being tucked so as to be closely attached to the light guide member 3 and to the light emitting diode package 1, which improves workability and light guiding property.

A phosphor emits light when irradiated with exciting light. The light is emitted basically from the surface of the phosphor, and only an area that is irradiated with light emits light. As in Example 5, in a case where an incident direction and an exiting direction of the excitation light are the same, it is considered that emitted light once returns in the incident direction to be reflected by the reflecting plate to be output, which may be the reason of decreasing efficiency. In view of this, shiny beads such as aluminum beads of 5 to 20 µm in diameter having high reflectivity are dispersed into a layer in which the green phosphor grains 16 are dispersed, thereby causing the light that has returned in the incident direction to be output at an early stage, so luminance efficiency is improved.

Figure 13:
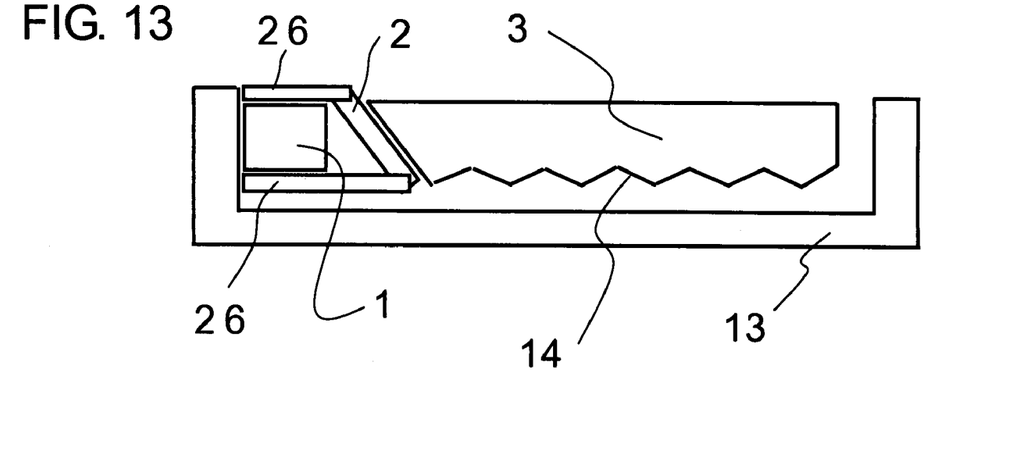
FIG. 13 is a cross-sectional view schematically illustrating a structure of a lighting device according to further another example of the present invention.
Figure 14:
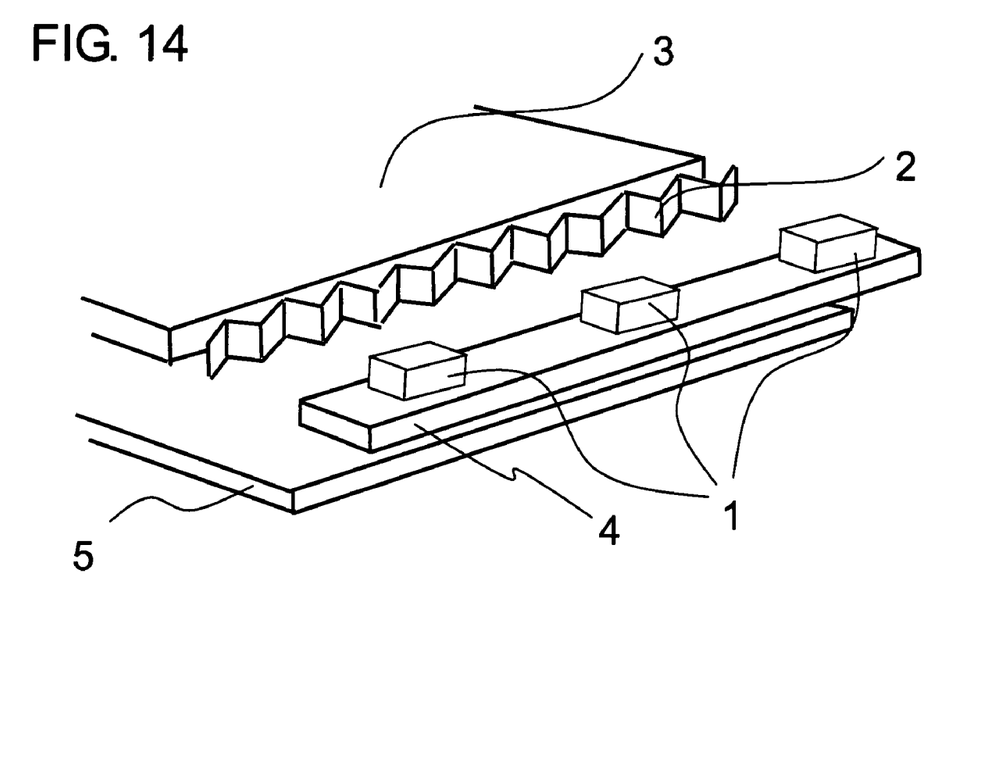
FIG. 14 is a perspective view schematically illustrating a structure of a lighting device according to further another example of the present invention.

Further, FIG. 13 illustrates a structure in which the fluorescent film 2 is arranged as being adjacent to the light emitting diode package 1 in such a manner that the fluorescent film 2 is inclined, rather than being perpendicular, to the light emitting direction of the light emitting diode package 1. With this structure, the incident direction of exciting light coincides with the light emitting direction of the fluorescent film 2, thereby improving light emitting efficiency. In FIG. 13, the fluorescent film 2 is arranged such that the light exiting surface of the fluorescent film 2 forms an acute angle with the light exiting surface of the light guide member 3. In contrast, it is also possible to arrange the fluorescent film 2 such that the light exiting surface thereof forms an obtuse angle with the light exiting surface of the light guide member 3. An ideal angle formed by the light exiting surface of the fluorescent film 2 with the light exiting surface of the light guide member 3 is one of 45 degrees and 135 degrees, however, even a slightest angle makes a difference. FIG. 14 also shows an example in which the light exiting surface of the fluorescent film 2 is arranged so as to form an angle with respect to the light exiting direction of the light emitting diode package 1. The example of FIG. 14 is different from that of FIG. 13 in that the fluorescent film 2 is accordion-folded so as to form a plurality of mountains and valleys in the fluorescent film 2 and arranged as being adjacent to the light entrance surface of the light guide member 3. The fluorescent film 2 is accordion-folded so as to have an increased number of phosphor grains located in the light traveling direction, to thereby increase the limit of the color conversion amount.

EXAMPLE 6

Figure 16:
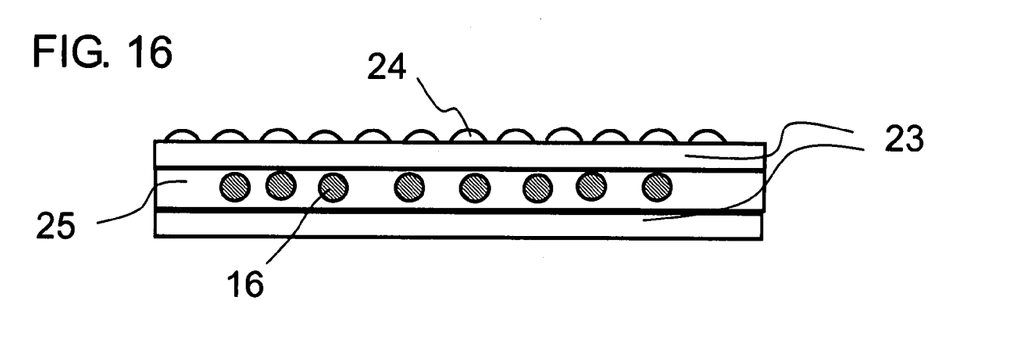
FIG. 16 is a cross-sectional view schematically illustrating a structure of a fluorescent film used in further another example of the present invention.
Figure 17:
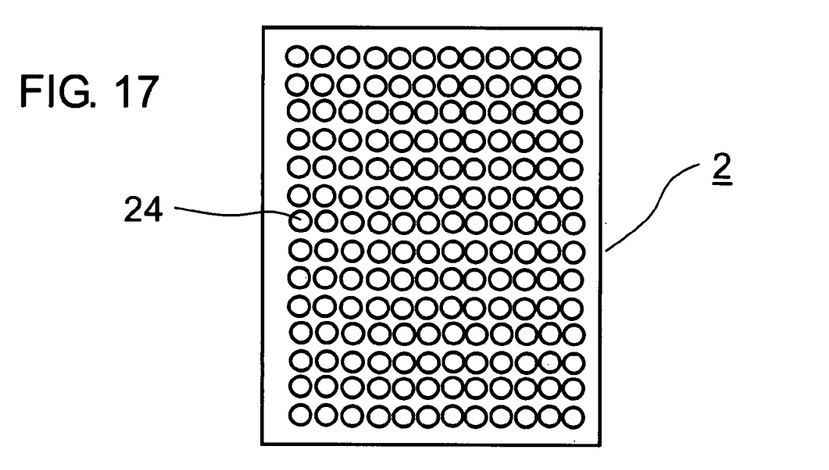
FIG. 17 is a plan view schematically illustrating a structure of a fluorescent film used in further another example of the present invention.
Figure 18:
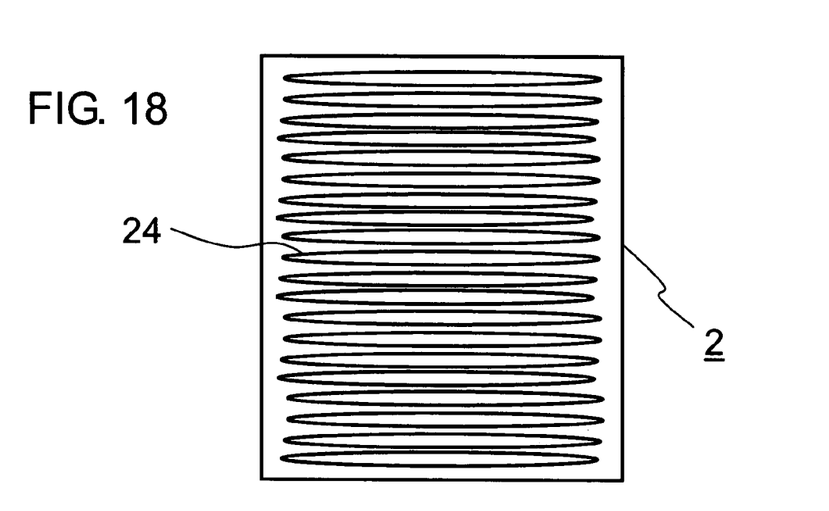
FIG. 18 is a plan view schematically illustrating a structure of a fluorescent film used in further another example of the present invention.

In Example 6, a description is given of a structure in which an upper surface of the aforementioned fluorescent film is provided with a lens. FIG. 16 is a cross-sectional view illustrating a structure in which the fluorescent film 2 of Examples 4 and 5 is provided with lenses 24. FIG. 17 is a schematic diagram illustrating the arrangement pattern of the lenses 24 on the fluorescent film 2 viewed from the upper surface side. The lenses 24 are each formed of a transparent resin, such as acrylic, to have a dorm shape of about 50 to 500 µm in diameter and about 25 to 250 µm in height, and arranged in a matrix at an interval of about 10 to 100 µm. With the lenses 24 thus provided, light is focused in a targeted direction. Further, according to Example 6, the lenses 24 are directly provided to the fluorescent film 2, rather than being separately provided as a lens sheet, in order to reduce an interface area. With the reduced interface area as well as the light focusing effect of the lenses 24, it is possible to thereby significantly improve luminance as a surface emitting light source. FIG. 18 is a plan view of the fluorescent film 2, on which the lenses 24 are each formed into an elongated dorm shape, rather than a circular dorm shape. In this case as well, the dorms are each formed to have a width of about 50 to 500 µm and a height of about 25 to 250 µm, and are arranged in stripe lines at intervals of about 10 to 100 µm. With this structure, it is possible to obtain the same effect as the effect obtained in the case of FIG. 17 where the lenses 24 are formed into a circular dorm shape. The elongated dorm shape increases an area of the lens, to thereby attain a higher light focusing effect. However, the lenses arranged in stripe lines may produce moire patterns when used in combination with an LCD or the like, so it is preferable to selectively adopt one of the circular dorm shape and the elongated dorm shape depending on the situation. In the case where the non-light emitting area 26 is provided on the periphery of the fluorescent film 2 as described in Example 4, it is not necessary to provide the non-light emitting area 26 with the lenses 24 of Example 6.

EXAMPLE 7

Figure 15:
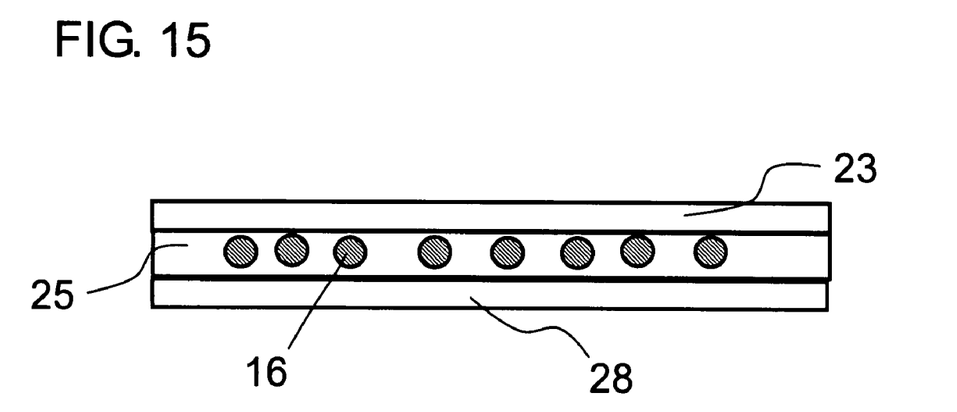
FIG. 15 is a cross-sectional view schematically illustrating a structure of a reflecting plate having a fluorescent function used in the example of the present invention.

The lighting device of Example 7 is described with reference to FIGS. 1 and 15. Similarly to Example 3, the light emitting diode package 1 is structured such that the blue LED element 10 is potted in a resin 7 in which the red phosphor grains 8 are dispersed. Example 7 is different from Example 3 in terms of the arrangement of the fluorescent film 2. In FIG. 1, the fluorescent film 2 is arranged on the light exiting surface of the light guide member 3. Alternatively, the fluorescent film 2 may also be arranged between the reflecting plate 5 and the light guide member 3. In this case, the fluorescent film 2 may not be provided with a prism layer or a diffusion layer. The fluorescent film 2 may be formed integrally with the reflecting plate 5 so as to eliminate the interface therebetween, which not only suppresses an optical loss but also brings benefits in terms of reducing thickness and cost. FIG. 15 schematically illustrates a structure of a reflecting plate 28 having a fluorescent function. The reflecting plate 28 is obtained by evaporating silver or aluminum onto a base film and providing a transparent cover layer thereon. Printed on a reflecting surface of the reflecting plate 28 is the adhesive layer 25 in which the green phosphor grains 16 are dispersed, and the moisture-proof film 23 is further laminated thereon. With the above-mentioned structure, a metal layer and the moisture-proof film 23 of the reflecting plate 28 protect the green phosphor grains 16 from moisture. Therefore, the reliability of the fluorescent film 2 increases.

According to the lighting device of the present invention, it is possible to obtain white light through additive multicolor mixture. At the same time, emitted light from the green phosphor is not used as exciting light for exciting the red phosphor or the yellow phosphor. Therefore, the lighting device with high light emitting efficiency and ultralong lifetime can be attained. The lighting device of the present invention may be used in combination with an LCD panel, to thereby realize a liquid crystal display device having high color reproducibility with high luminance and long lifetime. Further, the phosphors are arranged inside and outside of an LED package, respectively, so as to be separated from each other, which makes it easy to adjust chromaticity merely by adjusting only an amount of a phosphor contained in an outside film. Therefore, it is possible to provide a light source optimized for the chromaticity of an individual panel.

What is claimed is:

1. A lighting device that surface-emits light from a light emitting surface of a light emitting element and that guides the emitted light using a light guide member, the lighting device comprising:
   a first wavelength conversion member provided between the light emitting element and the light guide member for converting light emitted from the light emitting device into light having a first peak wavelength, the first wavelength conversion member being contained in a resin potting the light emitting element;
   a second wavelength conversion member for converting light emitted from the light emitting device into light having a wavelength shorter than the first peak wavelength; and
   a film having a layer containing the second wavelength conversion member, the film being provided on a light emitting surface side of the light guide member.

2. A lighting device that surface-emits light from a light emitting surface of a light emitting element and that guides the emitted light using a light guide member, the lighting device comprising:
   a first wavelength conversion member for converting light emitted from the light emitting device into light having a first peak wavelength;
   a second wavelength conversion member for converting light emitted from the light emitting device into light having a wavelength shorter than the first peak wavelength; and
   a film provided on a light emitting surface side of the light guide member, the film having a first layer containing the first wavelength conversion member and a second layer containing the second wavelength conversion member.

3. A lighting device according to claim 1; further comprising a resin layer in which transparent beads of one of acrylic and silica are dispersed, the resin layer being provided on the light emitting side with respect to the second wavelength conversion member.

4. A lighting device according to claim 1; wherein the film layer contains transparent beads of one of acrylic and silica dispersed therein.

5. A lighting device that surface-emits light from a light emitting surface of a light emitting element and that guides the emitted light using a light guide member, the lighting device comprising:
   a first wavelength conversion member for converting light emitted from the light emitting device into light having a first peak wavelength;
   a second wavelength conversion member for converting light emitted from the light emitting device into light having a wavelength shorter than the first peak wavelength; and
   a film provided between the light emitting element and the light guide member, the film having a first layer containing the first wavelength conversion member and a second layer containing the second wavelength conversion member.

6. A lighting device according to claim 1; wherein the film layer comprises an adhesive layer, and the film is obtained by laminating the second wavelength conversion member with a pair of films through the adhesive layer.

7. A lighting device according to claim 6; wherein the adhesive layer is provided on a peripheral portion of the film and comprises an area which is free of the second wavelength conversion member.

8. A lighting device according to claim 7; wherein the film is tucked in so that the area free of the second wavelength conversion member is located outside an optical path of light emitted from the light emitting element.

9. A lighting device according to claim 7; wherein the area free of the second wavelength conversion member is provided with a reflecting layer.

10. A lighting device according to claim 8; wherein the film is tucked in so that the film covers the light emitting element; and wherein the film is arranged such that a light emitting surface thereof is oriented in any direction other than an orthogonal direction and a parallel direction with respect to an incident direction of light from the light emitting element.

11. A lighting device according to claim 1; further comprising transparent lenses in a dorm shape which are arranged in a matrix, the lenses being provided outside the film layer so that the lenses are close to a light exiting side.

12. A lighting device according to claim 1; further comprising transparent lenses in an elongated dorm shape which are arranged in stripes, the lenses being provided outside the film layer so that the lenses are close to a light exiting side.

13. A lighting device according to claim 1; wherein the first wavelength conversion member comprises a red phosphor for converting light emitted from the light emitting element into red light through excitation of the light; and wherein the second wavelength conversion member comprises a green phosphor for converting light emitted from the light emitting element into green light through excitation of the light.

14. A lighting device according to claim 13; further comprising one of a second red phosphor and a yellow phosphor which converts light emitted from the light emitting element into yellow light through excitation of the light, the one of the second red phosphor and the yellow phosphor being provided between the red phosphor and the green phosphor.

15. A lighting device according to claim 1; wherein the first wavelength conversion member comprises a red phosphor for converting light emitted from the light emitting element into red light through excitation of the light; wherein the second wavelength conversion member comprises a green phosphor for converting light emitted from the light emitting element into green light through excitation of the light; and wherein the film is provided thereon with one of a second red phosphor and a yellow phosphor which converts light emitted from the light emitting element into yellow light through excitation of the light.

16. A display device in which a display element of a non-self light emission type is illuminated by using light emitted from a light emitting element and guided by a light guide member, the display device comprising:
   a first wavelength conversion member for converting light emitted from the light emitting element into light having a first peak wavelength through excitation of the light, the first wavelength conversion member being contained in a resin potting the light emitting element;
   a second wavelength conversion member for converting light emitted from the light emitting element into light having a wavelength shorter than the first peak wavelength; and
   a film having a layer containing the second wavelength conversion member, the film being provided on a light emitting surface side of the light guide member.

17. A lighting device according to claim 1; wherein the second wavelength conversion member is contained in the light guide member.

18. A lighting device according to claim 1; wherein the second wavelength conversion member is provided on a light emitting surface side of the light guide member.

19. A lighting device according to claim 1; wherein the first and second wavelength conversion members are provided in an optical path between the light emitting element and a light emitting surface of the lighting device; and wherein the first and second wavelength conversion members are arranged in an order such that the first and second peak wavelengths decrease as a distance between the light emitting element and each of the first and second wavelength conversion members increases.

20. A lighting device according to claim 2; wherein the first and second wavelength conversion members are provided in an optical path between the light emitting element and a light emitting surface of the lighting device; and wherein the first and second wavelength conversion members are arranged in an order such that the first and second peak wavelengths decrease as a distance between the light emitting element and each of the first and second wavelength conversion members increases.

21. A lighting device according to claim 5; wherein the first and second wavelength conversion members are provided in an optical path between the light emitting element and a light emitting surface of the lighting device; and wherein the first and second wavelength conversion members are arranged in an order such that the first and second peak wavelengths decrease as a distance between the light emitting element and each of the first and second wavelength conversion members increases.

22. A display device according to claim 16; wherein the first and second wavelength conversion members are provided in an optical path between the light emitting element and the display element in a manner that the first wavelength conversion member and the second wavelength conversion member are separated from each other; and wherein the first wavelength conversion member is arranged such that a distance between the first wavelength conversion member and the light emitting element is shorter than a distance between the second wavelength conversion member and the light emitting element.

* * * * *